(12) United States Patent
Aoyama et al.

(10) Patent No.: US 11,876,030 B2
(45) Date of Patent: Jan. 16, 2024

(54) CLAD MATERIAL AND METHOD FOR PRODUCING SAME

(71) Applicants: Dowa Holdings Co., Ltd., Tokyo (JP); The Goodsystem Corporation, Gyeonggi-do (KR)

(72) Inventors: Tomotsugu Aoyama, Tokyo (JP); Hiroto Narieda, Tokyo (JP); Ilho Kim, Gyeonggi-do (KR); Meoung whan Cho, Gyeonggi-do (KR)

(73) Assignees: DOWA HOLDINGS CO., LTD., Tokyo (JP); THE GOODSYSTEM CORPORATION, Gyeonggi-do (KR)

( * ) Notice: Subject to any disclaimer, the term of this patent is extended or adjusted under 35 U.S.C. 154(b) by 389 days.

(21) Appl. No.: 16/771,730

(22) PCT Filed: Dec. 3, 2018

(86) PCT No.: PCT/JP2018/044388
§ 371 (c)(1),
(2) Date: Jun. 11, 2020

(87) PCT Pub. No.: WO2019/116946
PCT Pub. Date: Jun. 20, 2019

(65) Prior Publication Data
US 2021/0175147 A1    Jun. 10, 2021

(30) Foreign Application Priority Data
Dec. 11, 2017   (JP) .................................. 2017-237100

(51) Int. Cl.
*C22C 27/04*    (2006.01)
*B32B 5/16*    (2006.01)
(Continued)

(52) U.S. Cl.
CPC ............ *H01L 23/3735* (2013.01); *B32B 5/16* (2013.01); *B32B 15/16* (2013.01); *B32B 15/20* (2013.01);
(Continued)

(58) Field of Classification Search
CPC .............. B32B 15/16; B32B 2264/108; B32B 2264/403; B32B 2255/205;
(Continued)

(56) References Cited

U.S. PATENT DOCUMENTS

2016/0130519 A1* 5/2016 Zhao ..................... B32B 15/043
508/109
2018/0328677 A1* 11/2018 Kim .................... H01L 23/3735

FOREIGN PATENT DOCUMENTS

JP         61009985 A  *  1/1986  ............. B23K 20/16
JP      2006001232 A     1/2006
(Continued)

OTHER PUBLICATIONS

Machine translation of KR20160120887A, published Oct. 19, 2016, Powered by EPO and Google. (Year: 2016).*
(Continued)

*Primary Examiner* — Monique R Jackson
(74) *Attorney, Agent, or Firm* — Bachman & LaPointe, P.C.

(57) ABSTRACT

There are provided a clad material and a method for producing the same, the clad material being capable of preventing cracks from being formed and preventing the separation of layers thereof from being caused, even if it is punched by press-working (even if a high shearing force is applied thereto by thermal shock. After each of Mo—Cu layers 10, which has a metal film 10*a* of a metal selected from the group consisting of Co, Ti, Pd, Pt and Ni on at least one side thereof is arranged on a corresponding one of both sides of (Continued)

a Cu-graphite layer 12, which is obtained by sintering a graphite powder having a Cu film on the surface thereof, so as to allow the metal film 10a to contact the Cu-graphite layer 12, the layers are heated while a pressure is applied between the Cu-graphite layer 12 and the Mo—Cu layers 10.

19 Claims, 5 Drawing Sheets

(51) Int. Cl.
*B32B 15/16* (2006.01)
*B32B 15/20* (2006.01)
*H01L 23/373* (2006.01)
*C22C 9/00* (2006.01)
C23C 18/38 (2006.01)
H01L 21/48 (2006.01)
H01L 23/00 (2006.01)

(52) U.S. Cl.
CPC ............... *C22C 9/00* (2013.01); *C22C 27/04* (2013.01); *B32B 2255/06* (2013.01); *B32B 2255/205* (2013.01); *B32B 2264/108* (2013.01); *B32B 2264/403* (2020.08); *C23C 18/38* (2013.01); *H01L 21/4882* (2013.01); *H01L 23/562* (2013.01)

(58) Field of Classification Search
CPC ..... B32B 2255/06; B32B 15/043; B32B 5/16; B32B 15/20; H01L 23/3735; H01L 23/3736; H01L 21/4882; H01L 23/562; C22C 9/00; C22C 27/04; C23C 18/34
See application file for complete search history.

(56) References Cited

FOREIGN PATENT DOCUMENTS

| | | | |
|---|---|---|---|
| JP | 2008155489 A | | 7/2008 |
| JP | 2010077013 A | | 4/2010 |
| JP | 2012238733 A | * | 12/2012 |
| JP | 2014515876 A | | 7/2014 |
| KR | 20140105069 A | | 9/2014 |
| KR | 20150010352 A | | 1/2015 |
| KR | 20160120887 A | | 10/2016 |
| WO | 2011096542 A1 | | 8/2011 |

OTHER PUBLICATIONS

Machine translation of JPS619985A, published Jan. 1985, Powered by EPO and Google. (Year: 1985).*
Machine translation of JP2012238733A, published Dec. 2012, Powered by EPO and Google. (Year: 2012).*
International search report for application No. PCT/JP2018/044388 dated Dec. 3, 2018.

* cited by examiner

CLAD MATERIAL AND METHOD FOR PRODUCING SAME

TECHNICAL FIELD

The present invention relates generally to a clad material and a method for producing the same. More specifically, the invention relates to a clad material which can be suitably used as the material of a heat radiating plate for electronic part mounting substrates.

BACKGROUND ART

Heat radiating plates for electronic part mounting substrates are required to efficiently emit heat which is produced from electronic parts, such as semiconductor elements, for use in power modules, radio frequency (RF) modules and so forth, so that the heat radiating plates are required to have excellent thermal conductivity.

As the materials of such heat radiating plates, there are proposed a composite material wherein a crystalline carbon material layer of graphite, carbon fibers, carbon nano-tubes or the like is laminated on a metallic layer of Cu, Al, Ag, Mg, W, Mo, Si, Zn or the like to be caused to be composite (see, e.g., Patent Document 1), a carbon-metal composite material wherein a heat transfer layer containing copper or aluminum as a main component is formed on a compact substrate containing carbon as a main material (see, e.g., Patent Document 2), a thermal conductive composite material wherein a high-temperature pyrolytic graphite layer is arranged between a pair of metallic substrates (see, e.g., Patent Document 3), a metal matrix composite plate of a metal matrix composite wherein a metal is filled in a carbonaceous member (see, e.g., Patent Document 4) and so forth.¥

However, these conventional materials of heat radiating plates have a thermal conductivity of about 300 W/mK at most, so that they are insufficient to be used as the materials of heat radiating plates for substrates which are used for mounting thereon power transistors and which are required to have higher thermal conductivity.

In order to solve such a problem, there is proposed a heat radiating plate material wherein a cover layer of at least one selected from the group consisting of Mo, an Mo—Cu alloy, W, a W—Cu alloy, Cr and a Cr—Cu alloy is laminated on each of both sides of a core layer of a composite material (Cu—C) wherein a carbon phase is caused to be composite in a Cu matrix (see, e.g., Patent Document 5).

PRIOR ART DOCUMENT(S)

Patent Document(s)

Patent Document 1: JP2006-1232A (Paragraph Number 0006)
Patent Document 2: JP2010-77013A (Paragraph Number 0009)
Patent Document 3: JP2014-515876A (Paragraph Number 0008)
Patent Document 4: WO2011/096542A (Paragraph Number 0009)
Patent Document 5: KR10-2016-0120887A (Paragraph Number 0013)

SUMMARY OF THE INVENTION

Problem to be Solved by the Invention

However, in the heat radiating plate material disclosed in Patent Document 5, there is some possibility that the separation on the boundary surface between the cover layer and the core layer may be caused by shearing force when it is punched by press-working in order to produce a heat radiating plate, or caused by thermal shock to the heat radiating plate.

It is therefore an object of the present invention to eliminate the aforementioned conventional problems and to provide a clad material, which is capable of preventing cracks from being formed therein and preventing the separation of layers thereof from being caused, even if it is punched by press-working (even if a high shearing force is applied thereto by thermal shock), and a method for producing the same.

Means for Solving the Problem

In order to accomplish the aforementioned object, the inventors have diligently studied and found that it is possible to produce a clad material, which is capable of preventing cracks from being formed therein and preventing the separation of layers thereof from being caused, even if it is punched by press-working (even if a high shearing force is applied thereto by thermal shock), by a method comprising the steps of: preparing a Cu-graphite layer by sintering a graphite powder having a Cu film on the surface thereof; preparing Mo—Cu layers, each of which has a metal film of a metal selected from the group consisting of Co, Ti, Pd, Pt and Ni on at least one side thereof; arranging each of the Mo—Cu layers on a corresponding one of both sides of the Cu-graphite layer so as to allow the metal film of a corresponding one of the Mo—Cu layers to contact the corresponding one of both sides of the Cu-graphite layer; and heating the Cu-graphite layer and the Mo—Cu layers while a pressure is applied between the Cu-graphite layer and the Mo—Cu layers. Thus, the inventors have made the present invention.¥

According to the present invention, there is provided a method for producing a clad material, the method comprising the steps of: preparing a Cu-graphite layer by sintering a graphite powder having a Cu film on the surface thereof; preparing Mo—Cu layers, each of which has a metal film of a metal selected from the group consisting of Co, Ti, Pd, Pt and Ni on at least one side thereof; arranging each of the Mo—Cu layers on a corresponding one of both sides of the Cu-graphite layer so as to allow the metal film of a corresponding one of the Mo—Cu layers to contact the corresponding one of both sides of the Cu-graphite layer; and heating the Cu-graphite layer and the Mo—Cu layers while a pressure is applied between the Cu-graphite layer and the Mo—Cu layers.

In this method for producing a clad material, each of Cu layers of Cu may be arranged on the opposite side of the corresponding one of the Mo—Cu layers to the metal film when the Mo—Cu layers are arranged. The Mo—Cu layers and the Cu layers may be heated while a pressure is applied between the Mo—Cu layers and the Cu layers, when the Cu-graphite layer and the Mo—Cu layers are heated while the pressure is applied between the Cu-graphite layer and the Mo—Cu layers. Each of the Cu layers is preferably made of a rolled copper foil. The Cu-graphite layer is preferably prepared by sintering the graphite powder having the Cu film on the surface thereof by heating it while a pressure is applied thereto. Each of the Mo—Cu layers having the metal film on at least one side thereof is preferably prepared by forming the metal film on at least one side of the corresponding one of the Mo—Cu layers of an Mo—Co alloy by sputtering, vapor deposition or plating.

According to the present invention, there is provided a clad material comprising: a Cu-graphite layer of a sintered body of a graphite powder having a Cu film on the surface thereof; and Mo—Cu layers, each of which is laminated on a corresponding one of both sides of the Cu-graphite layer via a metal film of a metal selected from the group consisting of Co, Ti, Pd, Pt and Ni.

In this clad material, a Cu layer of Cu may be laminated on the opposite side of a corresponding one of the Mo—Cu layers to the metal film. The metal film preferably has a thickness of 10 to 500 nm. The metal film is preferably intermittently arranged between the Cu-graphite layer and the corresponding one of the Mo—Cu layers.

Effects of the Invention

According to the present invention, it is possible to produce a clad material, which is capable of preventing cracks from being formed therein and preventing the separation of layers thereof from being caused, even if it is punched by press-working (even if a high shearing force is applied thereto by thermal shock).

MODE FOR CARRYING OUT THE INVENTION

First Preferred Embodiment

Figure 1:
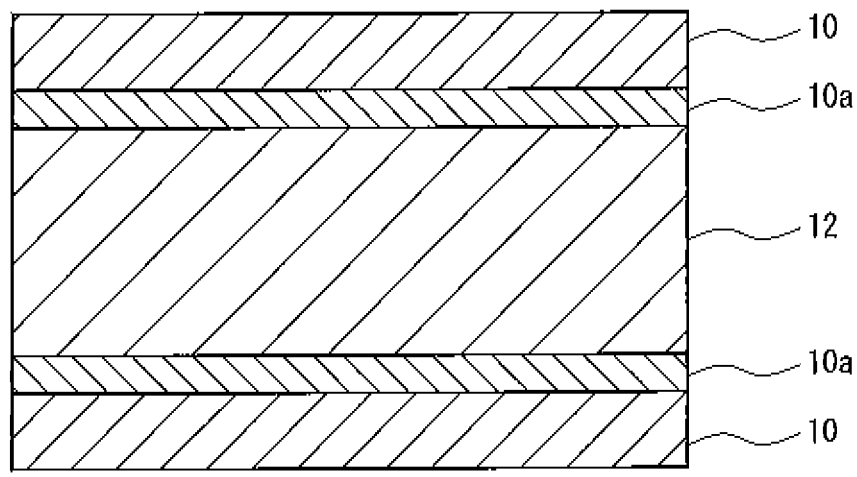
FIG. 1 is a sectional view for explaining the first preferred embodiment of a method for producing a clad material according to the present invention.

As shown in FIG. 1, in the first preferred embodiment of a method for producing a clad material according to the present invention, each of Mo—Cu layers 10, which has a metal film 10a of a metal selected from the group consisting of Co, Ti, Pd, Pt and Ni on at least one side thereof, is arranged on a corresponding one of both sides of a Cu-graphite layer 12, which is obtained by sintering a graphite powder having a Cu film on the surface thereof, so as to allow the metal film 10a to contact the corresponding one of both sides of the Cu-graphite layer 12, and thereafter, the layers are bonded to each other by heating while a pressure is applied between the Cu-graphite layer 12 and the Mo—Cu layers 10. Furthermore, the metal of the metal film 10a is preferably Co or Ti, and more preferably Co, from the standpoint of the adhesion between the Cu-graphite layer 12 and the Mo—Cu layers 10 and from the standpoint of the costs thereof.

The graphite powder having the Cu film on the surface thereof can be produced by, e.g., a method comprising the steps of: causing a graphite powder (preferably a flake-shaped graphite powder) having an average particle diameter (an average value of lengths (lengths of major axes) in longitudinal directions of particles) of 100 to 150 μm (preferably 110 to 140 μm) (obtained by classifying a commercially-available graphite powder by means of a sieve or the like) to be heated at 400° C. for about 30 to 90 minutes to be activated; preparing a slurry by adding 1 to 5 parts by weight (preferably 2 to 4 parts by weight) of glacial acetic acid serving as a coagulant, 50 to 60 parts by weight of copper sulfate pentahydrate, 5 to 15 parts by weight of pure water, and 10 to 20 parts of a granulated substance of Zn, Fe, Al or the like (having a higher electronegativity than that of a metal of an aqueous copper salt solution and having a size of 0.1 to 1.0 mm) serving as a substituting solvent, to 10 to 20 parts by weight of the graphite powder (so as to be able to satisfactorily form a Cu film on the surface of the activated graphite powder); and substituting and depositing Cu (from the slurry containing copper sulfate remaining without being dissolved) by electroless plating while the slurry is stirred at room temperature. The graphite powder thus having the Cu film on the surface thereof is preferably dipped in a solution for 15 to 25 minutes (in order to prevent corrosion in the atmosphere), the solution being prepared by mixing distilled water, sulfuric acid, phosphoric acid and tartaric acid (preferably in a weight ratio of 75:10:10:5), to be washed with water (in order to remove acid remaining on the surface of the graphite powder having the Cu film on the surface thereof), to be heated at 50 to 60° C. in the atmosphere to be dried, to obtain a graphite powder having a Cu film having a thickness of 0.3 to 3 μm on the surface thereof.

Figure 3:
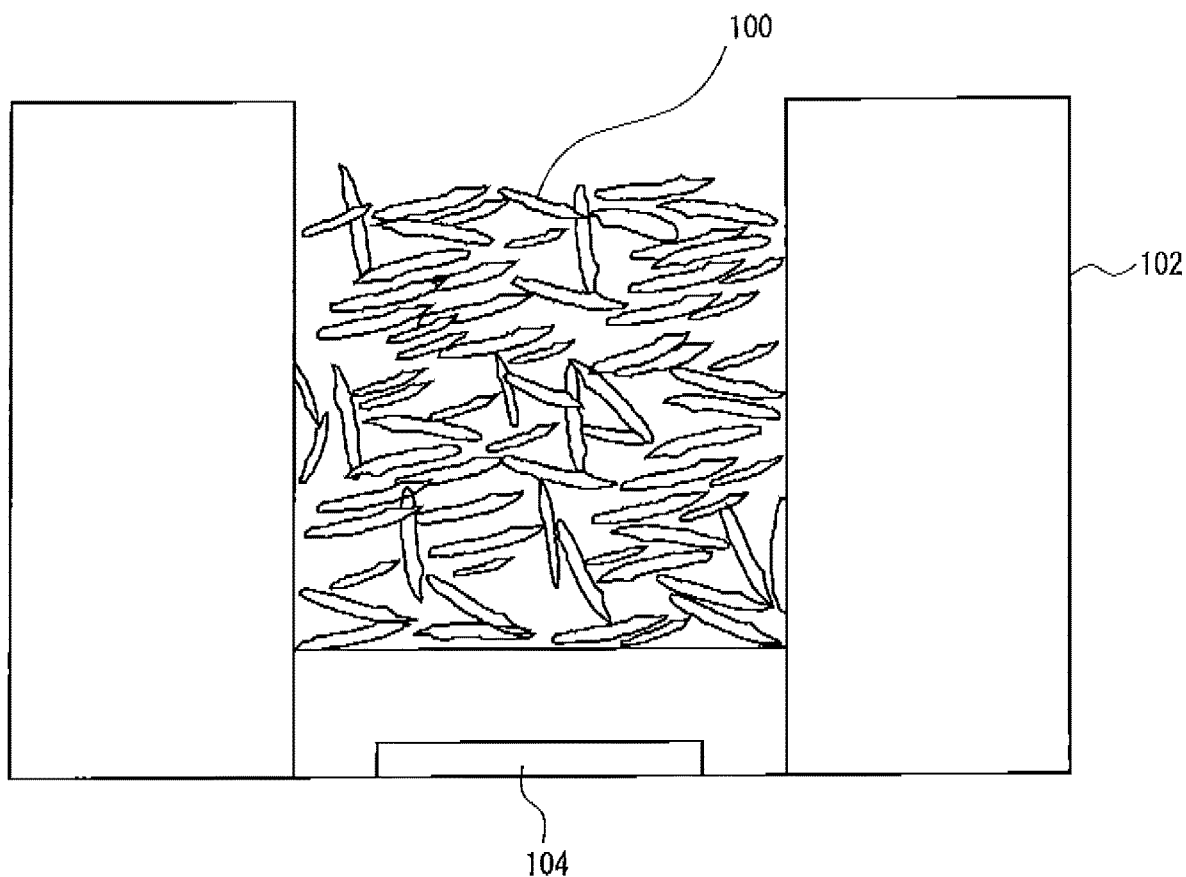
FIG. 3 is an illustration schematically showing a state that a graphite powder having a Cu film on the surface thereof is charged in a die in the first and second preferred embodiments of a method for producing a clad material according to the present invention.
Figure 4:
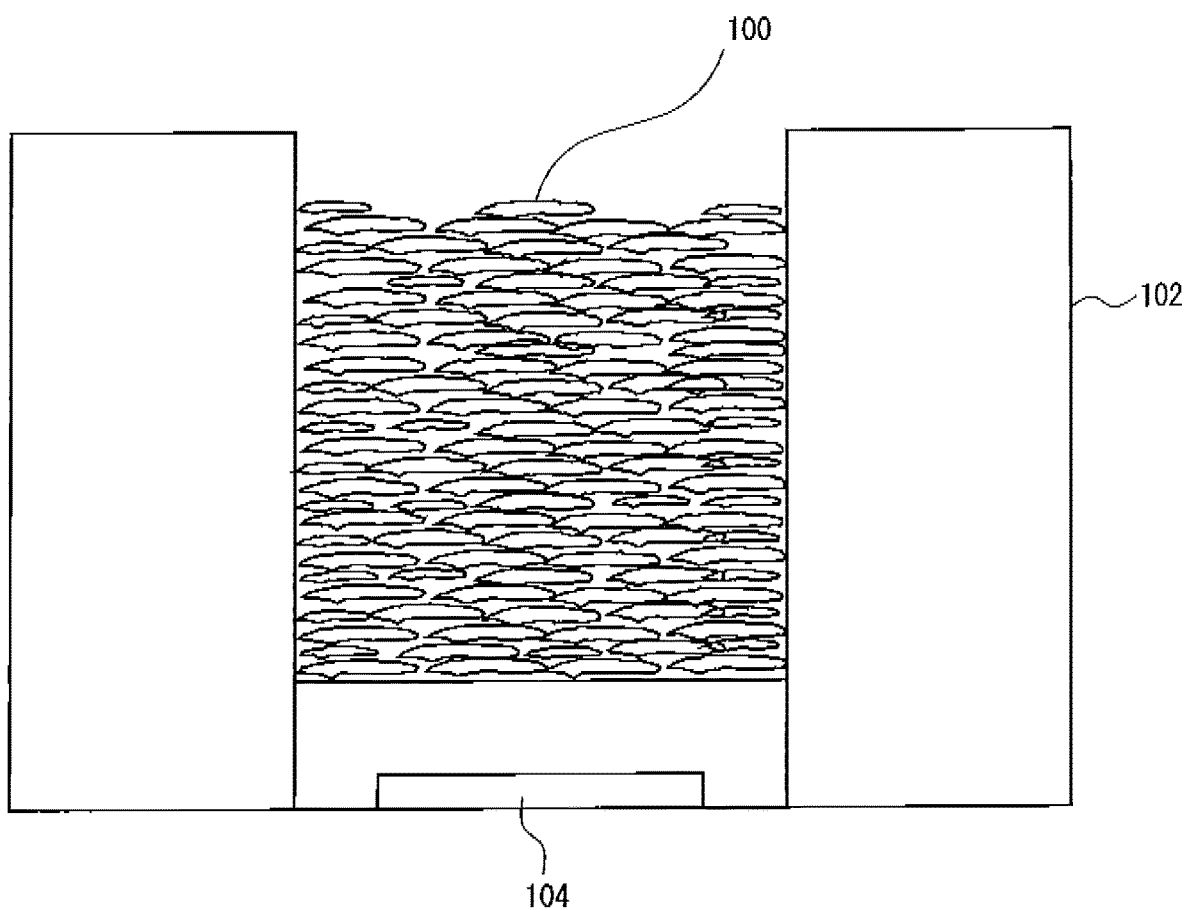
FIG. 4 is an illustrate schematically showing a state that the graphite powder having the Cu film on the surface thereof is caused to vibrate in the die in the first and second preferred embodiment of a method for producing a clad material according to the present invention.
Figure 5:
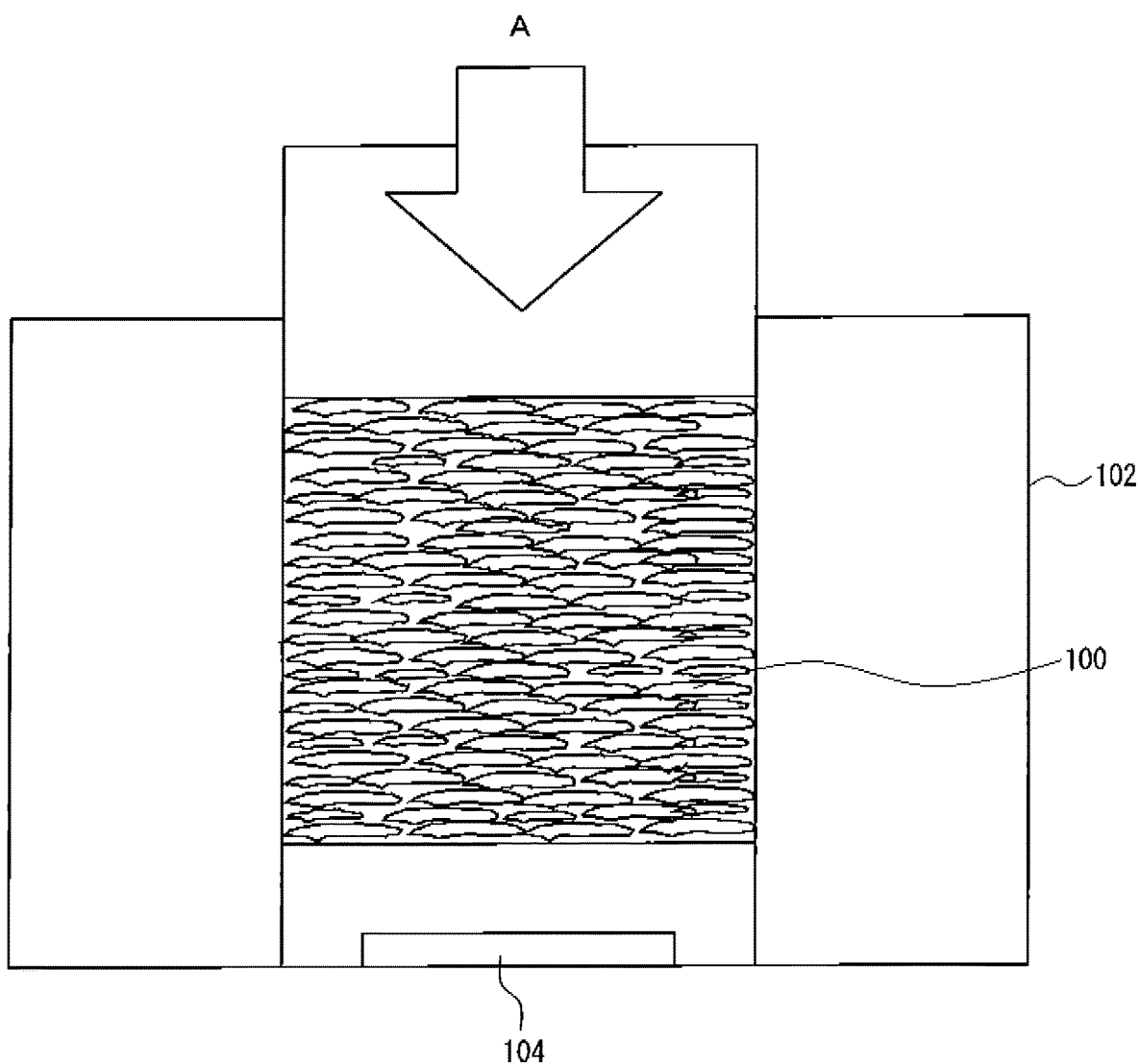
FIG. 5 is an illustrate schematically showing a step that the graphite powder having the Cu film on the surface thereof is pressurized in the die in the first and second preferred embodiment of a method for producing a clad material according to the present invention.
Figure 6:
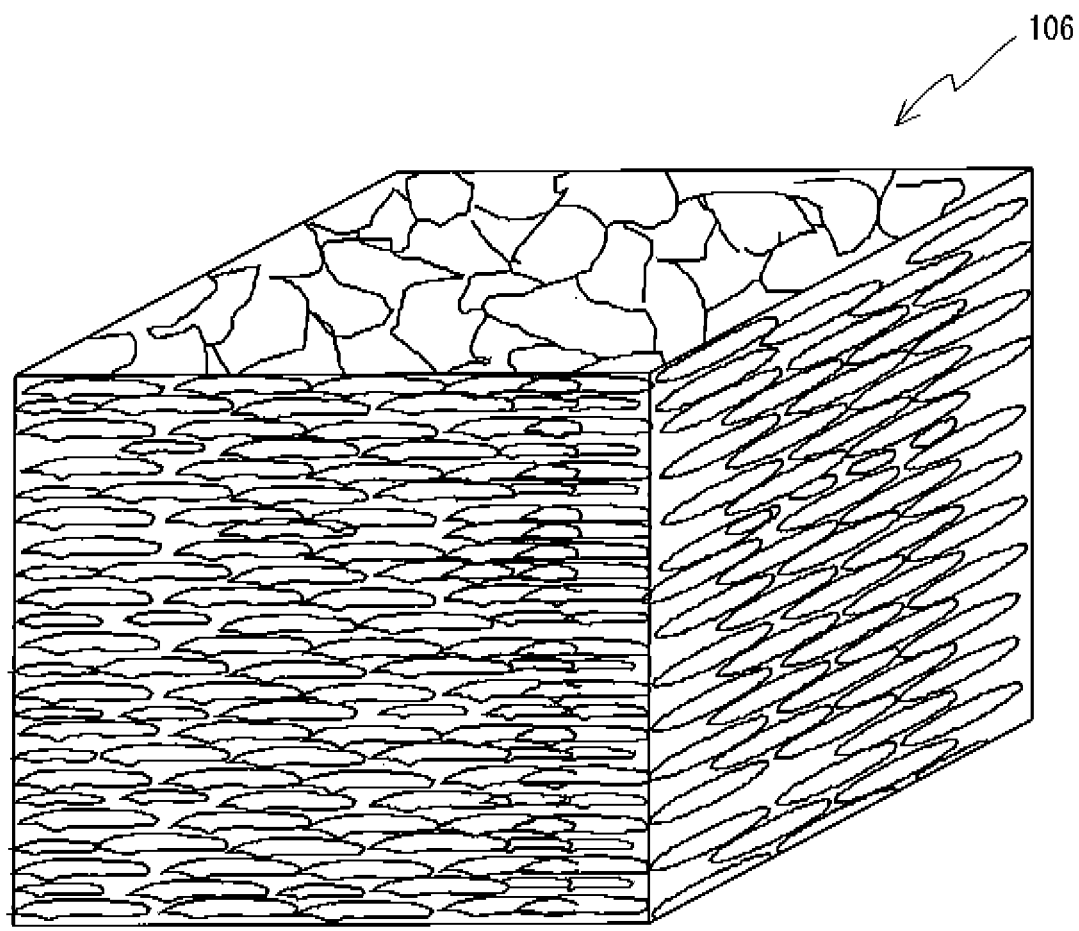
FIG. 6 is a perspective view schematically showing a bulk material (a sintered body of a graphite powder having the Cu film on the surface thereof) produced by the first and second preferred embodiments of a method for producing a clad material according to the present invention.

The Cu-graphite layer (Cu-graphite plate) 12 can be obtained by a method comprising the steps of: causing the above-described graphite powder 100 having the Cu film on the surface thereof to be charged in a die (or container) 102 as shown in FIG. 3; causing the die (or container) 102 to vibrate using an ultrasonic vibration means 104, such as an ultrasonic vibrator, to cause the graphite powder (having the Cu film on the surface thereof) in the die (or container) 102 to orientate so as to extend in specific directions (substantially horizontal directions) (as shown in FIG. 4); producing a molded body for sintering by uniaxial-pressing the graphite powder by a pressurizing force in an uniaxial direction from above in the die (or container) 102 (preferably in order to maintain the orientation structure of the graphite powder as it is) (as shown by arrow A in FIG. 5); sintering the molded body by heating at a temperature of preferably 860 to 1030° C. (which is lower than 1083° C., which is the melting point of Cu, by a temperature of 223 to 53° C.) while applying a pressure (preferably of 10 to 100 MPa) thereto by means of an electric sintering apparatus, to obtain a bulk material (a sintered body of the graphite powder having the Cu film on the surface thereof) 106 having a structure wherein the graphite powder having the Cu film on the surface thereof is caused to orientate in specific directions (substantially horizontal directions); and cutting the bulk material 106 in perpendicular directions with respect to the orientated directions of the graphite powder (orientated in substantially horizontal directions) by means of a diamond wire cutting machine, a laser or the like. Furthermore, the Cu-graphite layer (Cu-graphite plate) 12 is formed so that the percentage (area ratio) of the area occupied by Cu with respect to the area of the Cu-graphite layer is preferably 10 to 60 area % (more preferably 20 to 60 area %) on a cross-section which is cut in thickness directions thereof (a cross-section perpendicular to the orientated directions of the graphite powder). The percentage (area ratio) of the area occupied by Cu with respect to the area of the Cu-graphite layer can be calculated as the percentage of the area occupied by Cu with respect to the area of the Cu-graphite layer on the cross-section (the cross-section perpendicular to the orientated directions of the graphite powder) of the clad material, which is cut in thickness directions thereof, when a region of 703 µm×528 µm on the cross-section is observed at 1024 pixels×768 pixels by means of a laser microscope after the cross-section is buff-polished.

Each of the Mo—Cu layers 10 is preferably a (rolled) plate of an Mo—Cu alloy. If the cross-section of each of the Mo—Cu layers 10, which is cut in thickness directions thereof, is analyzed by means of an electron probe micro analyzer (EPMA), the cross-section is preferably divided into two phases of a Cu phase and an Mo phase. The area occupied by the Cu phase with respect to the area of the Mo—Cu layer on the cross-section is preferably in the range of from 20 area % to 80 area %, and more preferably in the range of from 40 area % to 60 area %. Each of the Mo—Cu layers 10 may be an Mo—Cu plate which is produced (so that the percentage (area ratio) of the area occupied by the Cu phase with respect to the area of the Mo—Cu layer on the cross-section cut in thickness direction is 20 to 80 area % (preferably 40 to 60 area %)) by a method comprising the steps of: causing an Mo—Cu dual-phase alloy powder having an average particle diameter of 10 to 50 µm (preferably 20 to 40 µm) to be charged in a die; applying a pressure of 150 to 250 MPa (preferably 180 to 220 MPa) thereto by pressing to form a layer of an Mo—Cu powder; and pressurizing and sintering the layer by heating at 800 to 1100° C. (preferably 900 to 1000° C.) while applying a pressure of 50 to 110 MPa (preferably 70 to 90 MPa) thereto. Furthermore, the percentage (area ratio) of the area occupied by the Cu phase with respect to the area of the Mo—Cu layer 10 on the cross-section cut in thickness directions can be calculated as the percentage of the area occupied by the Cu phase with respect to the area of the Mo—Cu layer on the cross-section, from a compositional image in BE mode (COMPO image) which is obtained by observing a region having an area of 10200 µm$^2$ on a cross-section of the clad material, which is cut in thickness directions thereof, at a magnification of 600 by means of a scanning electron microscope (SEM) after the cross-section is buff-polished.

Each of the Mo—Cu layers 10 having the metal film 10a on at least one side thereof can be obtained by forming the metal film 10a having a thickness of 10 to 500 nm (preferably 50 to 100 nm) on at least one side of a corresponding one of the Mo—Cu layers 10 by sputtering, vapor deposition or plating. If the thickness of the metal film 10a is less than 10 nm, the bonding strength of the Cu-graphite layer 12 to the Mo—Cu layers 10 is too low, so that there is some possibility that the formation of cracks in the clad material and/or the separation of the layers may be caused when the clad material is punched by press-working. On the other hand, if the thickness of the metal film 10a exceeds 500 nm, there is some possibility that the thermal conductivity of the clad material may be 300 W/mK or less.

If each of the Mo—Cu layers 10 arranged on a corresponding one of both sides of the Cu-graphite layer 12 via the metal film 10a is heated at 800 to 1100° C. (preferably 900 to 1000° C.) for 1 to 2 hours while a pressure of 50 to 110 MPa (preferably 70 to 90 MPa) is applied between the Cu-graphite layer 12 and the Mo—Cu layers 10, it is possible to obtain a clad material wherein each of the Mo—Cu layers 10 is laminated on a corresponding one of both sides of the Cu-graphite layer 12 to be bonded thereto. Furthermore, when each of the Mo—Cu layers 10 is arranged on the corresponding one of both sides of the Cu-graphite layer 12 via the metal film 10a, it is preferably arranged so that the metal film 10a of the corresponding one of the Mo—Cu layers 10 contacts the cut section of the Cu-graphite layer 12. If it is thus arranged, it is possible to sufficiently enhance the thermal conductivity of the clad material in thickness directions thereof.

Furthermore, although the Cu-graphite layer 12 is bonded to the corresponding one of the Mo—Cu layers 10 via the metal film 10a, it is not required for the metal film 10a to be continuously arranged between the Cu-graphite layer 12 and the corresponding one of the Mo—Cu layers 10, and it may be intermittently arranged (so that interrupted portions exist) therebetween. If the metal film 10a has such interrupted (or discontinuous) portions, it is considered that it is difficult to be heat-resistant in thickness directions of the clad material, so that it is possible to more efficiently cause thermal diffusion than such a case that the metal film 10a is continuously arranged. It is considered that such portions, in which the metal film 10a is interrupted (discontinuous), are formed with an influence that the diffusion of the metal element of the meal film 10a proceeds, and it is considered that the Cu-graphite layer 12 is strongly bonded to the corresponding one of the Mo—Cu layers 10 in these portions.

Second Preferred Embodiment

Figure 2:
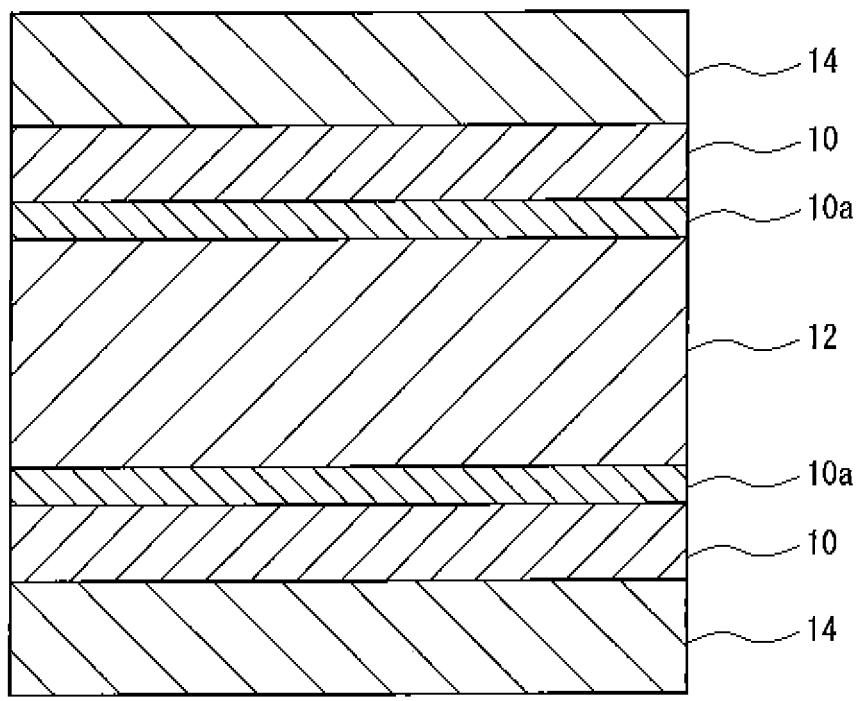
FIG. 2 is a sectional view for explaining the second preferred embodiment of a method for producing a clad material according to the present invention.

As shown in FIG. 2, in the second preferred embodiment of a method for producing a clad material according to the present invention, each of Mo—Cu layers 10, which has a metal film 10a of a metal (preferably Co or Ti, more preferably Co) selected from the group consisting of Co, Ti, Pd, Pt and Ni on at least one side thereof, is arranged on a corresponding one of both sides of a Cu-graphite layer 12, which is obtained by sintering a graphite powder having a Cu film on the surface thereof, so as to allow the metal film 10a to contact the corresponding one of both sides of the Cu-graphite layer 12, and each of Cu layers 14 of Cu is arranged on the opposite side of a corresponding one of the Mo—Cu layers 10 to the metal film 10a. Thereafter, the layers are bonded by heating while a pressure is applied between the Cu-graphite layer 12 and the Mo—Cu layers 10 and between the Cu layers 14 and the Mo—Cu layers 10. Each of the Cu layers is preferably a Cu plate of a rolled copper foil, and may be a Cu plate produced by applying a pressure of 150 to 250 MPa (preferably 180 to 220 MPa) to a Cu powder by pressing.

Furthermore, the graphite powder having the Cu film on the surface thereof, the Cu-graphite layer 12 obtained by sintering the graphite powder having the Cu film on the surface thereof, and each of the Mo—Cu layers 10 having the metal film 10a on at least one side thereof, can be produced by the same methods as those in the above-described first preferred embodiment.

If each of the Mo—Cu layers 10, which is arranged on a corresponding one of both sides of the Cu-graphite layer 12 via the metal film 10a, and each of the Cu films 14 of Cu, which is arranged on the opposite side of a corresponding one of the Mo—Cu layers 10 to the metal film 10a, are heated at 800 to 1100° C. (preferably 900 to 1000° C.) for 1 to 2 hours while a pressure of 50 to 110 MPa (preferably 70 to 90 MPa) is applied between the Cu-graphite layer 12 and the Mo—Cu layers 10 and between the Cu layers 14 and the Mo—Cu layers 10, it is possible to obtain a clad material wherein each of the Mo—Cu layers 10 is laminated on the corresponding one of both sides of the Cu-graphite layer 12 to be bonded thereto and wherein each of the Cu layers of Cu is laminated on the opposite side of the corresponding one of the Mo—Cu layer to the metal film to be bonded thereto.

Furthermore, in the above-described first and second preferred embodiments of a method for producing a clad material according to the present invention, the Cu-graphite layer is formed so that the percentage (area ratio) of the area occupied by Cu with respect to the area of the Cu-graphite layer is preferably 10 to 60 area % (more preferably 20 to 60 area %) on a cross-section of the clad material, which is cut in directions perpendicular to the surface of the clad material and perpendicular to the orientated directions of the graphite powder.

For example, the thickness of the clad material, which is produced by the above-described first and second preferred embodiments of a method for producing a clad material according to the present invention, is preferably about 0.5 to 2 mm when the clad material is used as the material of a base plate for a high-frequency module, and preferably about 2 to 5 mm when the clad material is used as the material of a base plate for a power module. With respect to the thickness of the clad material, the thickness of each of the Cu—Mo layers 10 is preferably 2 to 10%, the thickness of the Cu-graphite layer 12 is preferably 40 to 96%, and the thickness of each of the Cu layers 14 is preferably 0 to 20%.

EXAMPLES

Examples of a clad material and a method for producing the same according to the present invention will be described below in detail.

Example 1

First, a flake-shaped graphite powder having an average particle diameter of 130 μm was obtained by classifying a commercially-available flake-shaped graphite powder by means of a sieve. Furthermore, it was determined that this graphite powder was the flake-shaped graphite powder having the average particle diameter of 130 μm by observing the shape thereof on an image obtained by means of a microscope and by calculating the average particle diameter (the length of major axis) thereof. The graphite powder thus obtained was heated at 350° C. for 60 minutes to be activated. Thereafter, 3 parts by weight of glacial acetic acid, 57 parts by weight of copper sulfate pentahydrate, 10 parts by weight of pure water, and 15 parts by weight of Zn particles (having particle diameters of 0.7 mm) were mixed to 15 parts by weight of the graphite powder in this order to prepare a slurry. While this slurry was stirred at a rotation number of 25 rpm at room temperature, Cu was substituted and deposited (from the slurry containing copper sulfate remaining without being dissolved) by electroless plating to form a Cu plating film on the surface of the graphite powder. The graphite powder thus having the Cu film on the surface thereof was dipped in a solution, which was prepared by mixing distilled water, sulfuric acid, phosphoric acid and tartaric acid in a weight ratio of 75:10:10:5, for 20 minutes, washed with water, and then, heated at 55° C. in the atmosphere to be dried, to obtain a graphite powder having a Cu film having a thickness of 1 μm on the surface thereof.

The graphite powder having the Cu film on the surface thereof was charged in a die. Then, the die was caused to vibrate for 10 minutes by means of an ultrasonic vibrator, to cause the graphite powder (having the Cu film on the surface thereof) in the die to orientate so as to extend in substantially horizontal directions. Then, the graphite powder was uniaxial-pressed by a pressurizing force in an uniaxial direction from above in the die, to produce a molded body for sintering. This molded body was heated at 930° C. for 20 minutes while a pressure of 80 MPa was applied thereto by means of an electric sintering apparatus. The molded body was thus sintered to obtain a bulk material (a sintered body of the graphite powder having the Cu film on the surface thereof) having a structure wherein the graphite powder having the Cu film on the surface thereof was orientated in substantially horizontal directions. This bulk material was cut in perpendicular directions with respect to the orientated directions of the graphite powder (orientated in substantially horizontal directions) by means of a diamond wire cutting machine, to obtain a Cu-graphite plate (Cu-graphite layer) having a thickness of 790 μm.

Then, a Co film having a thickness of 75 nm was formed on one side of a commercially-available plate (Mo—Cu layer) of an Mo—Cu alloy (an alloy containing 50% by weight of Mo and the balance being copper) having a thickness of 50 μm by sputtering. This plate (Mo—Cu layer) of the Mo—Cu alloy having the Co film on the one side thereof was arranged in a die, and the above-described Cu-graphite plate (Cu-graphite layer) was arranged so that the cut section thereof was caused to contact the Co film formed on the one side of the Mo—Cu layer in the die. Then, the same plate as the above-described plate (Mo—Cu layer) of the Mo—Cu alloy having the Co film on the one side thereof was arranged so that the Co film was caused to contact the opposite cut section of the Cu-graphite plate. Then, the plates in the die were heated at 950° C. for 1.5 hours while a pressure of 80 MPa was applied thereto. Thus, there was obtained a clad material wherein each of the Mo—Cu layers having the thickness of 50 μm was laminated on a corresponding one of both sides of the Cu-graphite layer having the thickness of 790 μm.

The cross-section of this clad material cut in thickness directions thereof was analyzed by means of an electron probe micro analyzer (EPMA). As a result, it was confirmed that the obtained clad material was a clad material wherein each of Mo—Cu layers was laminated on a corresponding one of both sides of a Cu-graphite layer via a Co film.

After the cross-section (the cross-section perpendicular to the orientated directions of the graphite powder) of the clad material, which was cut in thickness directions thereof, was buff-polished, the percentage (area ratio) of the area occupied by Cu with respect to the area of the Cu-graphite layer on the cross-section was calculated when a region of 703 μm×528 μm on the cross-section was observed at 1024 pixels×768 pixels by means of a laser microscope. As a result, the area ratio was 30 area %.

Then, a region having an area of 10200 μm² on the cross-section of the clad material, which was cut in thickness directions thereof, was observed at a magnification of 600 by means of a scanning electron microscope (SEM). From the compositional image in BE mode (COMPO image) of this cross-section, the percentage (area ratio) of the area occupied by the Cu phase with respect to the area of the Mo—Cu layers on the cross-section was calculated. As a result, the area ratio was 50 area %.

The cross-section obtained by punching the obtained clad material in a rectangular shape having a size of 15 mm×25 mm by means of a die was observed at a magnification of 100 by means of an optical microscope. As a result, no cracks were observed.

The cross-section of the obtained clad material was observed at an accelerating voltage of 15 kV at a magnification of 600 at a beam diameter of 1 μm by means of a scanning electron microscope (SEM). With respect to the observed region (a region having a size of 200 μm×200 μm), the area analysis was carried out (at 249 pixels×183 pixels) by characteristic X-ray. As a result, a Co film was detected on the boundary surface between the Cu-graphite layer and each of the Mo—Cu layers. In this Co film, discontinuously interrupted portions (portions in which the detected level was ⅕ or less with respect to the maximum detected level in the area analysis) were observed.

The micrograph of the cross-section obtained by cutting the obtained clad material in thickness directions thereof was observed to evaluate the orientation of the graphite powder in the clad material. In the micrograph of the cross-section, assuming that the pressurizing directions during sintering were directions of Z-axis and that directions perpendicular to the directions of z-axis were directions of x-axis, if there was supposed a grid comprising 10 lines extending in directions of z-axis while being spaced from each other by 0.5 mm and 10 lines extending in directions of x-axis while being spaced from each other by 0.5 mm, there were measured angles between the z-axis and the normal vectors on the flake-shaped surface of the graphite powder existing at 100 points of intersection of the lines in the grid. As a result, the percentage in number of the normal vectors having the angles of 10° or less was 45%, the percentage in number of the normal vectors having the angles of more than 10° and not more than 20° was 23%, the percentage in number of the normal vectors having the angles of more than 20° and not more than 30° was 21%, and the percentage in number of the normal vectors having the angles of more than 30° was 11%. If the flake-shaped surface of the graphite powder is thus slightly inclined from substantially horizontal directions (directions substantially parallel to the surface of the clad material), it is possible to hold the high thermal conductivity of the clad material in thickness directions thereof and to greatly improve the thermal conductivity of the clad material in directions perpendicular to the thickness directions thereof.

Example 2

First, a commercially-available Cu plate (Cu layer) of a rolled copper foil having a thickness of 100 μm was arranged in a die. On this Cu plate (Cu layer), the same plate (Mo—Cu layer) of the Mo—Cu alloy having the Co film on one side thereof as that in Example 1 was arranged so as to allow the Co film to be turned up. On this Co film, the same Cu-graphite layer as that in Example 1 was arranged. On this Cu-graphite layer, the same plate (Mo—Cu layer) of the Mo—Cu alloy having the Co film on one side thereof as that in Example 1 was arranged so as to allow the Co film to be turned down. On this Mo—Cu layer, the same Cu plate (Cu layer) as the above-described Cu plate was arranged. Then, the plates in the die were heated at 950° C. for 1.5 hours while a pressure of 80 MPa was applied thereto. Thus, there was obtained a clad material wherein each of the Mo—Cu layers having the thickness of 50 μm was laminated on a corresponding one of both sides of the Cu-graphite layer having the thickness of 790 μm and wherein each of the Cu layers having the thickness of 100 μm was laminated on a corresponding one of outside surfaces of the Mo—Cu layers.

The cross-section of this clad material cut in thickness directions thereof was analyzed by the same method as that in Example 1. As a result, it was confirmed that the obtained clad material was a clad material wherein each of Mo—Cu layers was laminated on a corresponding one of both sides of a Cu-graphite layer via a Co film and wherein a Cu film was laminated on a corresponding one of outside surfaces of the Mo—Cu layers.

The percentage (area ratio) of the area occupied by Cu with respect to the area of the Cu-graphite layer on the cross-section of the clad material cut in the thickness directions thereof, and the percentage (area ratio) of the area occupied by the Cu phase with respect to a corresponding one of the Mo—Cu layers, were calculated by the same methods as those in Example 1. As a result, the percentages were 30 area % and 50 area %, respectively.

The cross-section obtained by punching the obtained clad material by means of the die by the same method as that in Example 1 was observed by the same method as that in Example 1. As a result, no cracks were observed. In the analysis of the cross-section of the clad material, the elemental analysis thereof was carried out in the range of a circle having a diameter of 10 μnm of a boundary portion between the Cu-graphite layer and each of the Mo—Cu layers. As a result, the weight percentage of Co was 0.4% by weight, and the weight percentage of Cu was 72.5% by weight, so that the ratio of the weight of Co to the weight of Cu was 0.55% by weight.

The thermal conductivity of the obtained clad material in thickness directions thereof was measured by a laser flash method. As a result, the thermal conductivity was 458 W/m·K.

Comparative Example 1

A clad material was obtained by the same method as that in Example 1, except that the Co film was not formed on one side of each of the Mo—Cu layers.

The cross-section of this clad material cut in thickness directions thereof was analyzed by the same method as that in Example 1. As a result, it was confirmed that no Co existed on the boundary surface between the Cu-graphite layer and each of the Mo—Cu layers and that the obtained clad material was a clad material wherein each of the Mo—Cu layers was laminated on a corresponding one of both sides of the Cu-graphite layer. The percentage (area ratio) of the area occupied by Cu with respect to the area of the Cu-graphite layer on the cross-section of the clad material cut in the thickness directions thereof, and the percentage (area ratio) of the area occupied by the Cu phase with respect to a corresponding one of the Mo—Cu layers, were calculated by the same methods as those in Example 1. As a result, the percentages were 30 area % and 50 area %, respectively. The cross-section obtained by punching the obtained clad material by means of the die by the same method as that in Example 1 was observed by the same method as that in Example 1. As a result, cracks were observed in the vicinity of the boundary surface between the Cu-graphite layer and each of the Mo—Cu layers.

Comparative Example 2

A clad material was obtained by the same method as that in Example 2, except that the Co film was not formed on one side of each of the Mo—Cu layers.

The cross-section of this clad material cut in thickness directions thereof was analyzed by the same method as that in Example 1. As a result, it was confirmed that no Co existed on the boundary surface between the Cu-graphite layer and each of the Mo—Cu layers and that the obtained clad material was a clad material wherein each of the Mo—Cu layers was laminated on a corresponding one of both sides of the Cu-graphite layer and wherein each of the Cu layers was laminated on a corresponding one of outside surfaces of the Mo—Cu layers. The percentage (area ratio) of the area occupied by Cu with respect to the area of the Cu-graphite layer on the cross-section of the clad material cut in the thickness directions thereof, and the percentage (area ratio) of the area occupied by the Cu phase with respect to a corresponding one of the Mo—Cu layers, were calculated by the same methods as those in Example 1. As a result, the percentages were 30 area % and 50 area %, respectively. The cross-section obtained by punching the obtained clad material by means of the die by the same method as that in Example 1 was observed by the same method as that in Example 1. As a result, cracks were observed in the vicinity of the boundary surface between the Cu-graphite layer and each of the Mo—Cu layers.

Comparative Example 3

A clad material was obtained by the same method as that in Example 2, except that a Cr film was substituted for the Co film to be formed on one side of each of the Mo—Cu layers.

The cross-section of this clad material cut in thickness directions thereof was analyzed by the same method as that in Example 1. As a result, it was confirmed that the obtained clad material was a clad material wherein each of the Mo—Cu layers was laminated on a corresponding one of both sides of the Cu-graphite layer via the Cr film and wherein each of the Cu layers was laminated on a corresponding one of outside surfaces of the Mo—Cu layers. The percentage (area ratio) of the area occupied by Cu with respect to the area of the Cu-graphite layer on the cross-section of the clad material cut in the thickness directions thereof, and the percentage (area ratio) of the area occupied by the Cu phase with respect to a corresponding one of the Mo—Cu layers, were calculated by the same methods as those in Example 1. As a result, the percentages were 30 area % and 50 area %, respectively. The cross-section obtained by punching the obtained clad material by means of the die by the same method as that in Example 1 was observed by the same method as that in Example 1. As a result, cracks were observed in the vicinity of the boundary surface between the Cu-graphite layer and each of the Mo—Cu layers.

Example 3

A clad material was obtained by the same method as that in Example 2, except that a Ti film was substituted for the Co film to be formed on one side of each of the Mo—Cu layers.

The cross-section of this clad material cut in thickness directions thereof was analyzed by the same method as that in Example 1. As a result, it was confirmed that the obtained clad material was a clad material wherein each of the Mo—Cu layers was laminated on a corresponding one of both sides of the Cu-graphite layer via the Ti film and wherein each of the Cu layers was laminated on a corresponding one of outside surfaces of the Mo—Cu layers. The cross-section obtained by punching the obtained clad material by means of the die by the same method as that in Example 1 was observed by the same method as that in Example 1. As a result, no cracks were observed. The thermal conductivity of the obtained clad material in thickness directions thereof was measured by a laser flash method. As a result, the thermal conductivity was 420 W/m·K.

INDUSTRIAL APPLICABILITY

A clad material according to the present invention can be utilized as the material of a heat radiating plate for an electronic part mounting substrate.

DESCRIPTION OF REFERENCE NUMBERS

10 Mo—Cu Layer
10a Metal Film
12 Cu-Graphite Layer
14 Cu Layer

The invention claimed is:

1. A method for producing a clad material, the method comprising the steps of:
   preparing a Cu-graphite layer by sintering a graphite powder having a Cu film on the surface thereof;
   preparing Mo—Cu layers, each of which has a metal film of a single metal selected from the group consisting of Co, Ti, Pd, Pt and Ni on at least one side thereof;
   arranging each of the Mo—Cu layers on a corresponding one of both sides of the Cu-graphite layer so as to allow the metal film of a corresponding one of the Mo—Cu layers to contact the corresponding one of both sides of the Cu-graphite layer; and
   heating the Cu-graphite layer and the Mo—Cu layers while a pressure is applied between the Cu-graphite layer and the Mo—Cu layers,
   wherein the metal film is intermittently arranged between the corresponding one of both sides of the Cu-graphite layer and the corresponding one of the Mo—Cu layers.

2. A method for producing a clad material as set forth in claim 1, wherein each of Cu layers of Cu is arranged on the opposite side of the corresponding one of said Mo—Cu layers to the metal film when said Mo—Cu layers are arranged and wherein said Mo—Cu layers and the Cu layers are heated while a pressure is applied between said Mo—Cu layers and the Cu layers, when said Cu-graphite layer and said Mo—Cu layers are heated while the pressure is applied between said Cu-graphite layer and said Mo—Cu layers.

3. A method for producing a clad material as set forth in claim 2, wherein each of said Cu layers is made of a rolled copper foil.

4. A method for producing a clad material as set forth in claim 1, wherein said Cu-graphite layer is prepared by sintering the graphite powder having the Cu film on the surface thereof by heating it while a pressure is applied thereto.

5. A method for producing a clad material as set forth in claim 1, wherein each of said Mo—Cu layers having said metal film on at least one side thereof is prepared by forming said metal film on at least one side of the corresponding one of said Mo—Cu layers by sputtering, vapor deposition or plating.

6. A method for producing a clad material as set forth in claim 1, wherein said Cu film is a Cu plating film.

7. A method for producing a clad material as set forth in claim 1, wherein said metal film has a thickness of 10 to 100 nm.

8. A clad material comprising:
   a Cu-graphite layer of a sintered body of a graphite powder having a Cu film on the surface thereof; and
   Mo—Cu layers, each of which is laminated on a corresponding one of both sides of the Cu-graphite layer via a metal film of a single metal selected from the group consisting of Co, Ti, Pd, Pt and Ni,
   wherein the metal film is intermittently arranged between the corresponding one of both sides of the Cu-graphite layer and a corresponding one of the Mo—Cu layers.

9. A clad material as set forth in claim 8, wherein a Cu layer of Cu is laminated on the opposite side of a corresponding one of said Mo—Cu layers to said metal film.

10. A clad material as set forth in claim 8, wherein said metal film has a thickness of 10 to 500 nm.

11. A clad material as set forth in claim 8, wherein said Cu film is a Cu plating film.

12. A clad material as set forth in claim 8, wherein said metal film has a thickness of 10 to 100 nm.

13. A method for producing a clad material, the method comprising the steps of:
   preparing a Cu-graphite layer by sintering a graphite powder having a Cu film on the surface thereof;
   preparing Mo—Cu layers, each of which has a metal film of a single metal selected from the group consisting of Co, Ti, Pd, Pt and Ni on at least one side thereof;
   arranging each of the Mo—Cu layers on a corresponding one of both sides of the Cu-graphite layer so as to allow the metal film of a corresponding one of the Mo—Cu layers to contact the corresponding one of both sides of the Cu-graphite layer; and
   heating the Cu-graphite layer and the Mo—Cu layers while a pressure is applied between the Cu-graphite layer and the Mo—Cu layers.

14. A method for producing a clad material as set forth in claim 13, wherein said metal film has a thickness of 10 to 100 nm.

15. A clad material comprising:
   a Cu-graphite layer of a sintered body of a graphite powder having a Cu film on the surface thereof; and
   Mo—Cu layers, each of which is laminated on a corresponding one of both sides of the Cu-graphite layer via a metal film of a single metal selected from the group consisting of Co, Ti, Pd, Pt and Ni.

16. A clad material as set forth in claim 15, wherein a Cu layer of Cu is laminated on the opposite side of a corresponding one of said Mo—Cu layers to said metal film.

17. A clad material as set forth in claim 15, wherein said metal film has a thickness of 10 to 500 nm.

18. A clad material as set forth in claim 15, wherein said Cu film is a Cu plating film.

19. A clad material as set forth in claim 15, wherein said metal film has a thickness of 10 to 100 nm.

* * * * *